United States Patent
Das et al.

(10) Patent No.: US 6,452,423 B1
(45) Date of Patent: Sep. 17, 2002

(54) CIRCUIT FOR AVOIDING CONTENTION IN ONE-HOT OR ONE-COLD MULTIPLEXER DESIGNS

(75) Inventors: Ashutosh Das, Sunnyvale; Sridhar Narayanan, Cupertino, both of CA (US)

(73) Assignee: Sun Microsystems, Inc., San Jose, CA (US)

( * ) Notice: Subject to any disclaimer, the term of this patent is extended or adjusted under 35 U.S.C. 154(b) by 0 days.

(21) Appl. No.: 09/624,514

(22) Filed: Jul. 24, 2000

(51) Int. Cl.[7] ............................................. H03K 19/084
(52) U.S. Cl. ...................... 326/113; 326/105; 326/46; 326/40; 327/407; 327/408
(58) Field of Search .......................... 326/40, 46, 105, 326/113; 327/407, 408

(56) References Cited

U.S. PATENT DOCUMENTS

| | | | | |
|---|---|---|---|---|
| 5,625,303 A | * | 4/1997 | Jamshidi | 326/106 |
| 5,955,912 A | * | 9/1999 | Ko | 327/410 |
| 6,087,855 A | * | 7/2000 | Frederick, Jr. et al. | 326/106 |

OTHER PUBLICATIONS

Digital Fundamentals, 4th edition, 1990, Thomas L. Floyd. pp. 103 and 200–202.*

* cited by examiner

*Primary Examiner*—Michael Tokar
*Assistant Examiner*—Vibol Tan
(74) *Attorney, Agent, or Firm*—Thelen Reid & Priest LLP

(57) ABSTRACT

A circuit for avoiding contention in such circuits as an n-to-1 transmission gate multiplexer in a high performance microprocessor or integrated circuit utilizes a same-gate symmetrical design and reverse polarity control signals to overcome disadvantages of prior circuits while accommodating increasing circuit speeds. The circuit employs all NAND gates on the select lines controlling multiplexer transmission gates rather than NAND gates and a NOR gate. The design may also be implemented using AND gates. In addition to using a NAND gate where prior designs use a NOR gate, the polarity of the flip-flop output which drives the additional NAND gate is inverted, and the polarity of the input to the transmission gate driven by the additional NAND gate is also inverted. The circuit thus provides a symmetric design using the same NAND logic gates on all select lines while preserving functionality of the n-to-1 multiplexer. The symmetry of the design avoids problems which are inherent to prior asymmetrical designs is having NAND gates and a NOR gate, such as uneven delays on the select lines which can result in a short circuit for brief periods of time and the additional design effort required to overcome loading on NOR gate inputs resulting from NOR gates having increased area.

14 Claims, 4 Drawing Sheets

CIRCUIT FOR AVOIDING CONTENTION IN ONE-HOT OR ONE-COLD MULTIPLEXER DESIGNS

BACKGROUND OF THE INVENTION

1. Field of the Invention

The present invention is generally directed to multiplexer circuit design. More specifically, the present invention is directed to avoiding contention in one-hot or one-cold multiplexer circuits which can result in abnormal circuit behavior or damage to the circuit.

2. Background

Microprocessor designs typically include multiplexer circuits which permit the selection of one of a number of input signals. Multiplexers are commonly implemented with AND and OR gates as illustrated in FIG. 1. In the simple example of FIG. 1, if the select line 100 is 1 or high, the logic value at "a" 102 is passed through to the output "c" 104, and if the select line 100 is 0 or low, the logic value at "b" 106 is passed through to the output "c" 104. The problem with such a simple AND/OR multiplexer is that it is slow by virtue of the fact that signals must pass through two levels of gates. It is therefore not used in high-speed microprocessor applications.

High performance microprocessor designs typically contain logic controlled by one-out-of-n input signals, such as an n-to-1 multiplexer implemented with n transmission gates. The high-speed bi-directional transmission gates are each enabled by a different select line. The AND/OR multiplexer of FIG. 1 is implemented as a transmission gate multiplexer as illustrated in FIG. 2. Rather than having just one select line and inverting it as in the AND/OR multiplexer, the transmission gate multiplexer has two select lines which avoids the need for two levels of logic. Referring to FIG. 2, when the select line sel1 200 is 0 or low, the logic value at "a" 202 is passed through to the output "c" 204, provided that select line sel2 206 is 1 or high so that the logic value at "b" 208 is also not passed through. Similarly, when the select line sel2 206 is 0 or low, the logic value at "b" 208 is passed through to the output "c" 204, provided that select line sel1 200 is 1 or high so that the logic value at "a" 202 is also not passed through. It is therefore apparent that the control logic 210 controlling the select lines 200, 206 must be designed to maintain the select lines in a one-cold condition, where only one of the select lines is low logic. That is, the control logic 210 can never permit both sel1 200 and sel2 206 to be 0 or low simultaneously. Such a condition can result in abnormal circuit behavior and possible circuit damage if the logic values at "a" 202 and "b" 208 are opposite values, such as where a=1 and b=0. This state of contention essentially creates a short circuit from a=1 (supply voltage) to b=0 (ground).

Although the control logic in multiplexer circuits is designed to avoid the problem of contention during normal circuit operation, other circumstances encountered during power-up and testing of the circuit can also create contentious states leading to abnormal circuit behavior and circuit damage. These circumstances are independent of the control logic design. The first circumstance occurs during system power-up where the state of the flip-flops controlling the multiplexer select lines, sel1 200 and sel2 206 in FIG. 2 for example, is unknown. The potential exists for both sel1 200 and sel2 206 to be 0 or low simultaneously, creating contention as described above.

The second circumstance which can lead to contention occurs during the testing mode of the multiplexer integrated circuit. During testing and debugging of a circuit design, known inputs should create expected outputs. When anomalous output is encountered, a circuit-testing routine typically stops the system clock and puts the circuit into a scan mode as is well known to those skilled in the art. The scan mode typically configures all the flip-flop registers in the circuit into one large shift register or scan chain. The scan chain is then shifted out, permitting the examination of data from each flip-flop to determine what condition within the circuit is causing the anomalous output. During shift-out of the scan chain, the possibility exists for multiplexer select lines such as sel1 200 and sel2 206 in FIG. 2 to be in a state which creates a contentious condition as described above.

The transmission gate multiplexer circuit of FIG. 3 more fully illustrates the problem of multiplexer contention during a scan chain shift. In the example circuit of FIG. 3, a 4-to-1 multiplexer structure is designed using four transmission gates. The non-inverting outputs "q" of flip-flops FF0, FF1, FF2 and FF3 drive select lines selb0, selb1, selb2 and selb3 respectively. The select lines of the multiplexer are active low (or logic "0"), and only one select line should be active at any given time for the multiplexer to function correctly. Under normal operation, this condition is usually ensured by the logic driving the flip-flop inputs. However, during the test mode, when the scan chain is being shifted, there is a possibility that more than one flip-flop output driving the multiplexer select lines will become low at the same time. As illustrated in FIG. 3, select lines selb0 300 and selb3 302 are both low (or logic "0") at the same time during the scan operation, resulting in a short circuit through transmission gates PS0 304 and PS3 306 between data input d0=1 308 (supply voltage) and data input d3=0 310 (ground).

A common solution to the potential contention created by shifting the scan chain during test mode or system power-up is illustrated by the circuit of FIG. 4. In the circuit of FIG. 4, three NAND gates ND0, ND1 and ND2, are incorporated into the select lines selb0, selb1 and selb2 respectively. In addition, one NOR gate, NR3, is incorporated into select line selb3. An extra control input tri_en_n, is provided to control these extra gates. In order to compensate for the polarity change of the select lines due to the addition of the extra gates, the inverting outputs "qb" of flip-flops FF0, FF1, FF2 and FF3 are used to drive select lines selb0, selb1, selb2 and selb3. During normal operation, the control input tri_en_n is kept at the logic high state. Therefore, the three NAND gates and one NOR gate operate as mere inverting logic, which again, is compensated for by using the inverting outputs "qb" of flip-flops, thus maintaining the same logic functionality during normal operation. However, during test mode when shifting the scan chain or at system power-up, the control input tri_en_n is forced to a logic low state which causes the three NAND gate outputs (i.e. selb0, selb1 and selb2) to be a logic high and the NOR gate output (i.e. selb3) to be a logic low. Therefore, the mutual exclusivity or one-cold condition on the multiplexer select lines is satisfied during the scan operation and at system power-up.

Although this is a simple solution, it suffers several disadvantages. The first problem is that of uneven delays in the multiplexer select lines. The delay of the three NAND gates is different than the delay of the one NOR gate. As is known to those skilled in the art, NOR gates have a longer delay than NAND gates by virtue of the differing P-type and N-type parallel and serial transistor configurations which make up NAND and NOR gates. During the time period of this delay difference on the multiplexer select lines, a short circuit can exist such as the one illustrated in FIG. 3 with a path formed through transmission gates PS0 304 and PS3

306 between data input d0=1 308 (supply voltage) and data input d3=0 310 (ground). Such a condition can cause abnormal circuit behavior and circuit damage. In order to avoid this problem, extra circuit design effort is necessary to ensure that the same delay is seen at the multiplexer select lines through both types of logic gates.

Furthermore, as is known to those skilled in the art, decreased mobility in P-type transistors versus N-type transistors means that P-type transistors are inherently slower than N-type transistors which in turn dictates that P-type transistors in NOR gates are made slightly larger than in NAND gates in order to compensate for the slower P-type transistor configuration in NOR gates. The NOR gate therefore takes up more space than the NAND gate which is a significant consideration as designers strive to decrease circuit size. In addition, the larger size of the NOR gate increases the loading on the NOR gate inputs being driven by the flip-flops, which requires yet further design consideration.

Thus, prior solutions to the problem of a contention resulting from shifting the scan chain during test mode or during system power-up are asymmetrical solutions which have design related problems as well as functional problems. Accordingly, there exists a need for a multiplexer circuit which overcomes disadvantages in the prior art in avoiding contention while maintaining functionality and during operations such as shifting the scan chain in a test mode and during system power-up.

SUMMARY OF THE INVENTION

A circuit for avoiding contention in such circuits as an n-to-1 transmission gate multiplexer in a high performance microprocessor or integrated circuit utilizes a same-gate symmetrical design and reverse polarity control signals to overcome disadvantages of prior circuits while accommodating increasing circuit speeds. The circuit employs all NAND gates on the select lines controlling multiplexer transmission gates rather than NAND gates and a NOR gate. The design may also be implemented using AND gates. In addition to using a NAND gate where prior designs use a NOR gate, the polarity of the flip-flop output which drives the additional NAND gate is inverted, and the polarity of the input to the transmission gate driven by the additional NAND gate is also inverted. The circuit thus provides a symmetric design using the same NAND logic gates on all select lines while preserving functionality of the n-to-1 multiplexer. The symmetry of the design avoids problems which are inherent to prior asymmetrical designs having NAND gates and a NOR gate, such as uneven delays on the select lines which can result in a short circuit for brief periods of time and the additional design effort required to overcome loading on NOR gate inputs resulting from NOR gates having increased area.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons having the benefit of this disclosure.

Figure 1:
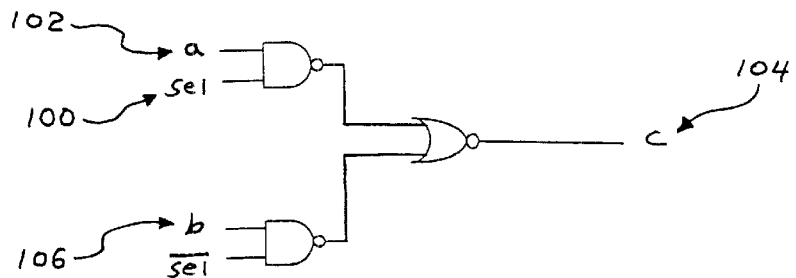
FIG. 1 is an electrical schematic diagram illustrating a simple multiplexer circuit implemented with AND and OR gates in accordance with the prior art.
Figure 2:
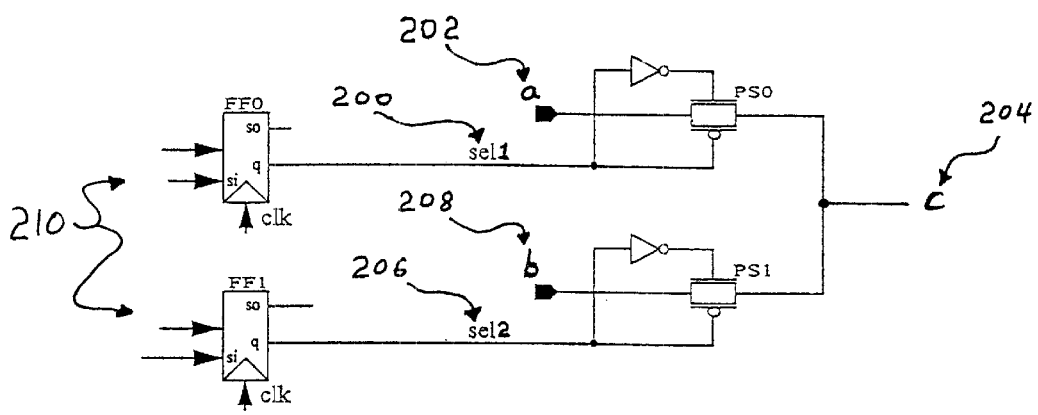
FIG. 2 is an electrical schematic diagram illustrating a transmission gate multiplexer typically used in high performance microprocessor designs in accordance with the prior art.
Figure 3:
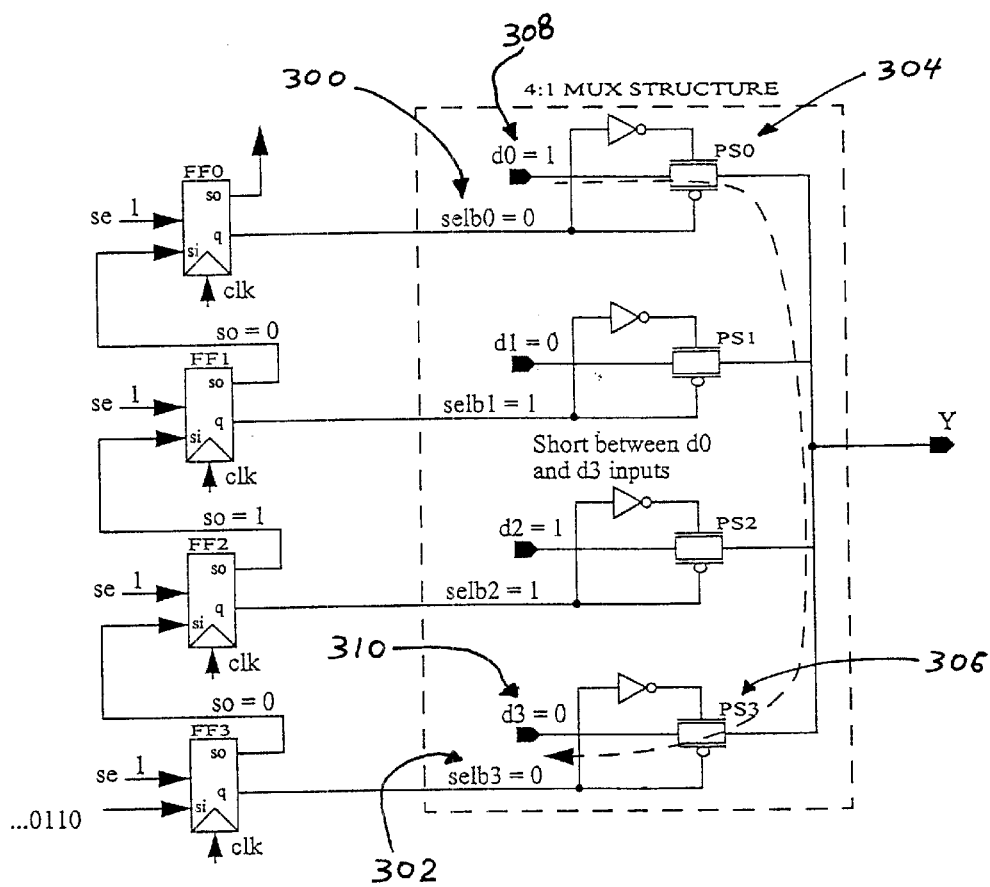
FIG. 3 is an electrical schematic diagram illustrating a transmission gate multiplexer circuit showing the problem of contention occurring during the shifting of the scan chain while in a test mode in accordance with the prior art.
Figure 4:
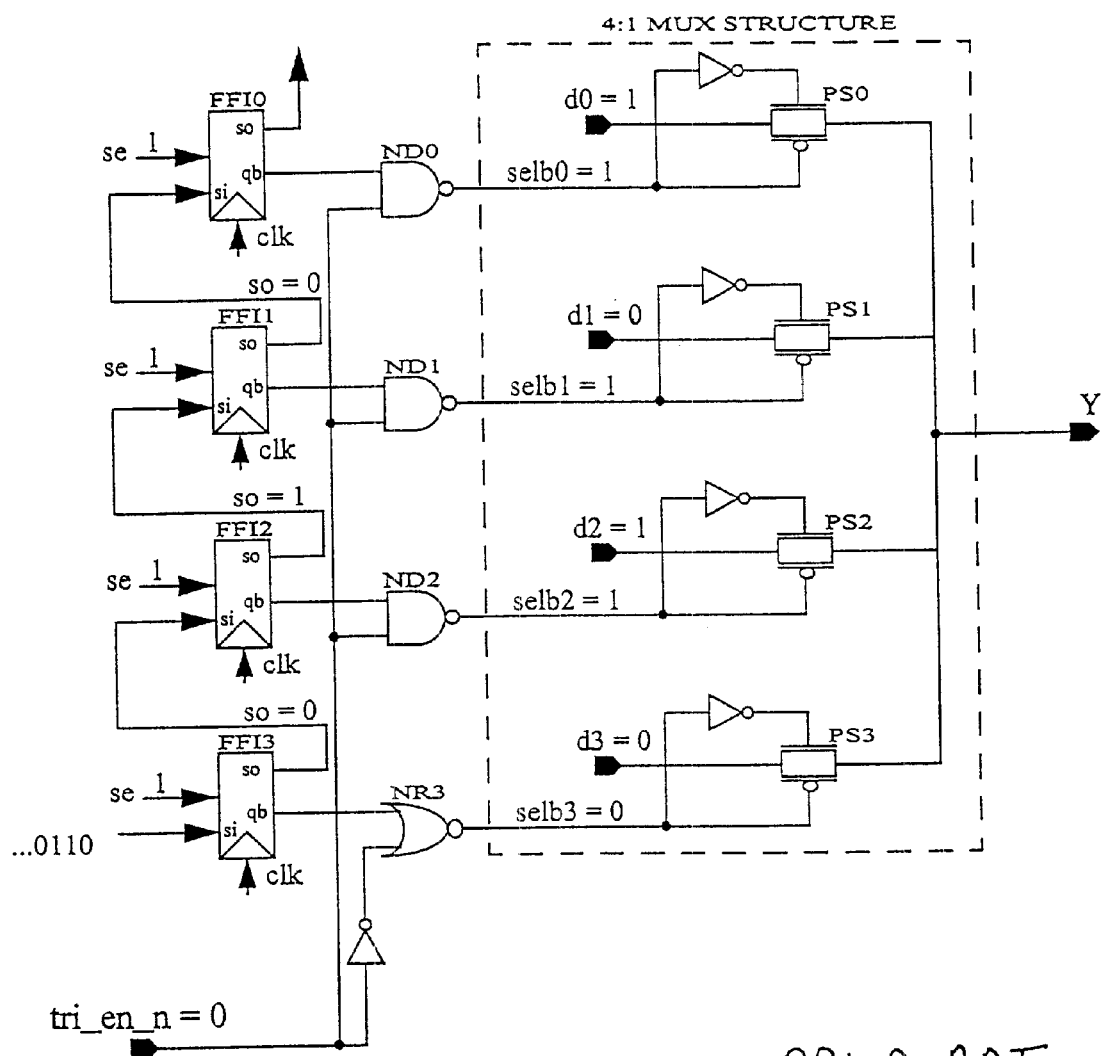
FIG. 4 is an electrical schematic diagram illustrating a transmission gate multiplexer circuit showing a common solution to the contentious condition created by shifting the scan chain during test mode in accordance with the prior art.
Figure 5:
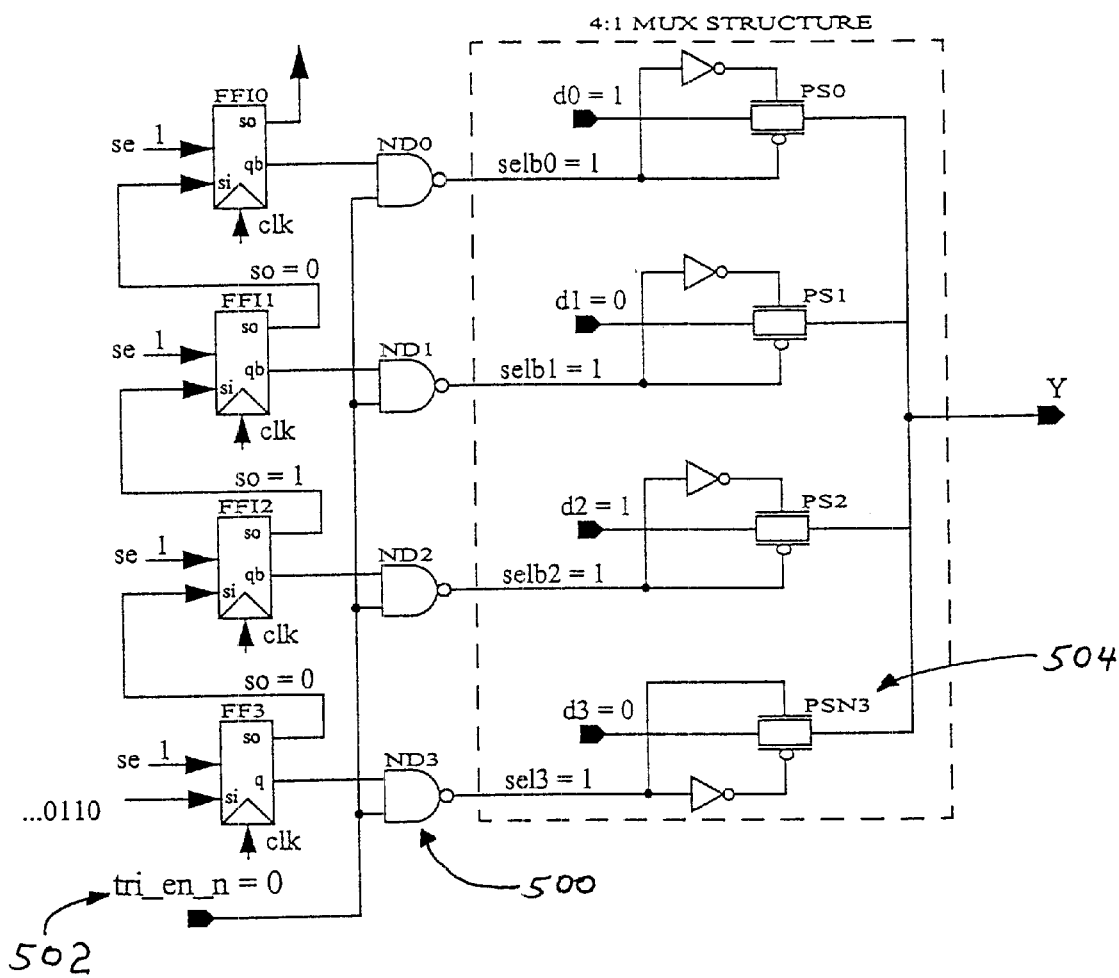
FIG. 5 is an electrical schematic diagram illustrating a transmission gate multiplexer circuit which solves the problem of contention created by shifting the scan chain during test mode in accordance with a specific embodiment of the present invention.

A specific embodiment of the present invention is illustrated by the circuit of FIG. 5. In contrast to the circuit of FIG. 4, which incorporates three NAND gates and one NOR gate in the select lines to avoid an adverse contentious state, the circuit of FIG. 5 uses a NAND gate on each select line. Although the circuit of FIG. 5 illustrates a 4-to-1 multiplexer structure, the present invention is not limited in this regard and is meant to apply to other circuits including any n-to-1 multiplexer circuit. In addition, the present invention is readily implemented using AND gates rather than NAND gates. Such an implementation is easily recognized by those skilled in the art.

Referring again to FIG. 5, the NAND gate ND3 500 replaces the NOR gate of FIG. 4. Thus, four NAND gates ND0, ND1, ND2 and ND3 are incorporated respectively on the four multiplexer select lines selb0, selb1, selb2 and sel3. As with the prior art circuit of FIG. 4, an extra control input tri_en_n 502 is provided to control the four NAND gates. In addition, the transmission gate PSN3 504 is modified so that the select input sel3 is active high. The transmission gate PSN3 504 corresponds to the transmission gate PS3 of the prior art circuit in FIG. 4 driven by the NOR gate NR3 that is replaced in the present invention by NAND gate ND3 500. The modification of transmission gate PSN3 504 essentially switches the polarities on the input legs to the gate 504. Finally, in order to compensate for the polarity change of the select lines selb0, selb1, selb2 and sel3 due to NAND gates ND0, ND1, ND2 and ND3, and thus preserve circuit functionality, the present invention uses the inverted flip-flop outputs "qb" to drive select lines selb0, selb1 and selb2 while using the non-inverted flip-flop output "q" to drive select line sel3 as illustrated in FIG. 5.

Referring to the circuit of FIG. 5, the control input tri_en_n 502 is kept at logic high during normal operation. Therefore, the four NAND gates operate as mere inverting logic. The extra inversion provided by these gates is compensated by using the inverting flip-flop outputs "qb" for NAND gates ND0, ND1 and ND2 and the non-inverting flip-flop output "q" for NAND gate ND3 500. The net effect of NAND gate ND3 500 is cancelled by the modification to transmission gate PSN3 504 as discussed above, which reverses the polarity of select line sel3.

During the test mode of the circuit of FIG. 5, the control input tri_en_n 502 is forced to a logic low when the scan chain is being shifted. This results in a logic high at the output of each of the four NAND gates (i.e. selb0, selb1, selb2 and sel3). Because of the modification to transmission gate PSN3 504 resulting in the reversed polarity of select line sel3, a logic high on sel3 serves to enable the PSN3 504 transmission gate. The remaining transmission gates PS0, PS1 and PS2 are disabled due to the logic high states on select line inputs selb0, selb1 and selb2. Thus, as with the prior art circuit of FIG. 4, the mutual exclusivity condition on the multiplexer select lines necessary for avoiding an adverse contentious condition is satisfied during scan operations by the circuit of the present invention illustrated in FIG. 5.

However, the present invention satisfies the mutual exclusivity condition on the multiplexer select lines with several important advantages over the prior art circuits such as that illustrated in FIG. 4. First of all, since the present invention uses only NAND gates on the input select lines, there is no uneven delay generated in the multiplexer select lines by having differing NAND and NOR gates on the select lines as in the circuit of FIG. 4. Without such uneven delay on the select lines, the short circuit condition which can otherwise occur through the transmission gates between data inputs during the brief period of the delay is no longer possible. Thus, the risk of abnormal circuit behavord circuit damage due to uneven delay between multiplexer select lines is eliminated. In addition, the extra circuit design effort normally required to ensure that the same delay is seen at the multiplexer select lines is no longer necessary.

Another important advantage the present invention has over prior circuits designed to avoid adverse contention is that it does not require the use of a NOR gate. Prior circuits require the use of NOR gates which are made slightly larger than NAND gates in order to compensate for the slower speed of the P-type s transistor configuration in NOR gates. The NOR gates therefore require more area than the NAND gates. In addition, the larger size of the NOR gate increases the loading on the NOR gate inputs being driven by the flip-flops. The present invention thus reduces the area required to implement the circuit for avoiding adverse contentious conditions and also eliminates the need for further design considerations related to driving the increased load on NOR gate inputs.

Alternative Embodiments

While embodiments and applications of this invention have been shown and described, it would be apparent to those skilled in the art having the benefit of this application that many more modifications than mentioned above are possible without departing from the inventive concepts herein. The invention, therefore, is not to be restricted except in the spirit of the appended claims.

What is claimed is:

1. A circuit for avoiding a contentious condition, comprising:

a transmission gate multiplexer having n transmission gates where n is more than one, each of said n transmission gates coupled respectively to n select lines and the $i^{th}$ transmission gate being a polarity-modified transmission gate that is active at a logic state opposite the logic state at which all other transmission gates are active;

n NAND gates coupled respectively to each of said n select lines, the $i^{th}$ NAND gate coupled to the $i^{th}$ select line corresponding to said $i^{th}$ transmission gate;

n flip-flops coupled respectively to a first input of said n NAND gates, the $i^{th}$ flip-flop coupled at its non-inverting output to said $i^{th}$ NAND gate and the remaining flip-flops coupled respectively at their inverting outputs to the remaining NAND gates; and a control input coupled to a second input on each of said n NAND gates.

2. The circuit as recited in claim 1, wherein said control input is at a high logic state during normal operation such that said n NAND gates operate as inverting logic.

3. The circuit as recited in claim 1, wherein said control input is at a low logic state during a test mode scan chain shift such that the outputs of said n NAND gates cause all of said n select lines to be a logic high, thereby activating said $i^{th}$ transmission gate and deactivating all other transmission gates.

4. The circuit as recited in claim 1, wherein said control input is at a low logic state during system power-up such that the outputs of said n NAND gates cause all of said n select lines to be a logic high, thereby activating said $i^{th}$ transmission gate and deactivating all other transmission gates.

5. The circuit as recited in claim 1, wherein said $i^{th}$ transmission gate is the $n^{th}$ transmission gate, said $i^{th}$ NAND gate is the $n^{th}$ NAND gate, said $i_{th}$ select line is the $n^{th}$ select line and said $i^{th}$ flip-flop is the $n^{th}$ flip-flop.

6. The circuit as recited in claim 1, wherein said inverting outputs of said remaining flip-flops compensate for the polarity change of said remaining NAND gates and said non-inverting output of said $i^{th}$ flip-flop is compensated for by said polarity-modified transmission gate such that the same logic functionality is maintained during normal operation.

7. The circuit as recited in claim 1, wherein said NAND gates are implemented as AND gates.

8. A method for avoiding a contentious condition in a transmission gate multiplexer having n transmission gates where n is more than one, comprising the steps of:

reversing the polarity of the $i^{th}$ transmission gate making said $i^{th}$ transmission gate active at a logic state opposite the logic state at which all other transmission gates are active;

driving each of said n transmission gates respectively with n select lines;

driving each of said n select lines respectively with n NAND gates, the $i^{th}$ NAND gate driving the $i^{th}$ select line corresponding to said $i^{th}$ transmission gate;

driving a first input of each of said n NAND gates respectively with n flip-flops, the non-inverting output of the $i^{th}$ flip-flop driving said $i^{th}$ NAND gate and the inverting outputs of the remaining flip-flops respectively driving the remaining NAND gates; and driving a second input on each of said n NAND gates with a control input.

9. The method as recited in claim 8, wherein said control input drives all of said second inputs to a high logic state during normal operation such that said n NAND gates operate as inverting logic.

10. The method as recited in claim 8, wherein said control input drives all of said second inputs to a low logic state during a test mode scan chain shift such that the outputs of said n NAND gates drive all of said n select lines to a logic high, thereby activating said $i^{th}$ transmission gate and deactivating all other transmission gates.

11. The method as recited in claim 8, wherein said control input drives all of said second inputs to a low logic state during system power-up such that the outputs of said n NAND gates drive all of said n select lines to a logic high, thereby activating said $i^{th}$ transmission gate and deactivating all other transmission gates.

12. The method as recited in claim 8, wherein said $i^{th}$ transmission gate is the $n^{th}$ transmission gate, said $i^{th}$ NAND gate is the $n^{th}$ NAND gate, said $i^{th}$ select line is the $n^{th}$ select line and said $i^{th}$ flip-flop is the $n^{th}$ flip-flop.

13. The method as recited in claim 8, wherein said inverting outputs of said remaining flip-flops compensate for the polarity change of said remaining NAND gates and said non-inverting output of said $i^{th}$ flip-flop is compensated for by said $i^{th}$ transmission gate such that the same logic functionality is maintained during normal operation.

14. The method as recited in claim 8, wherein said NAND gates are implemented as AND gates.

* * * * *

UNITED STATES PATENT AND TRADEMARK OFFICE
CERTIFICATE OF CORRECTION

PATENT NO.      : 6,452,423 B1
DATED           : September 17, 2002
INVENTOR(S)     : Ashutosh Das and Sridhar Narayanan It is certified that error appears in the above-identified patent and that said Letters Patent is hereby corrected as shown below:

<u>Title page,</u>
Item [57], ABSTRACT,
Line 18, please remove the word "is"

<u>Column 5,</u>
Line 20, replace "behavord" with -- behavior and --
Line 30, remove the letter "s"

Signed and Sealed this

Fourth Day of March, 2003

JAMES E. ROGAN
*Director of the United States Patent and Trademark Office*